(12) United States Patent
Potash (10) Patent No.: US 11,062,068 B2
(45) Date of Patent: *Jul. 13, 2021

(54) ELECTRONIC COMPUTER-AIDED DESIGN TOOL

(71) Applicant: Hanan Potash, Austin, TX (US)

(72) Inventor: Hanan Potash, Austin, TX (US)

( * ) Notice: Subject to any disclaimer, the term of this patent is extended or adjusted under 35 U.S.C. 154(b) by 110 days.

This patent is subject to a terminal disclaimer.

(21) Appl. No.: 15/985,676

(22) Filed: May 21, 2018

(65) Prior Publication Data

US 2018/0336303 A1   Nov. 22, 2018

Related U.S. Application Data (63) Continuation of application No. 15/048,435, filed on Feb. 19, 2016, now Pat. No. 9,984,186.

(51) Int. Cl.
*G06F 30/33* (2020.01)
*G06F 30/30* (2020.01)
*G06F 30/367* (2020.01)

(52) U.S. Cl.
CPC .............. *G06F 30/33* (2020.01); *G06F 30/30* (2020.01); *G06F 30/367* (2020.01)

(58) Field of Classification Search
CPC .......... G06F 30/00; G06F 16/22; G06F 30/30; G06F 30/367; G06F 11/261; G06F 30/39; G06F 11/221; G06F 2111/12; G06F 30/327; G06F 30/33; G06F 30/34; G06F 30/392; G06F 30/394; G06F 30/398; G06F 11/006; G06F 11/2289; G06F 11/32; G06F 11/34; G06F 11/3648; G06F 21/10; G06F 21/572; G06F 21/71; G06F 21/725; G06F 21/73; G06F 21/86; G06F 2111/02; G06F 2113/16; G06F 2119/04; G06F 2221/2135; G06F 30/20; G06F 30/23; G06F 40/103; G06F 40/137; G06F 8/41; G06F 11/26; G06F 11/36; G06F 11/3652; G06F 16/958; G06F 21/42; G06F 21/51; G06F 21/57; G06F 21/608; G06F 21/74; G06F 21/78; G06F 21/87; G06F 2221/034; G06F 2221/0737; G06F 2221/0775; G06F 2221/0782; G06F 2221/0797; G06F 2221/2101; G06F 2221/2105; G06F 2221/2137; G06F 2221/2141; G06F 2221/2143; G06F 2221/2147; G06F 2221/2149;

(Continued)

(56) References Cited

U.S. PATENT DOCUMENTS 9,984,186 B2 * 5/2018 Potash .................. G06F 30/33
2004/0193957 A1 * 9/2004 Swoboda ................ G06F 8/41
714/30

(Continued)

*Primary Examiner* — Binh C Tat
(74) *Attorney, Agent, or Firm* — Fish & Richardson P.C.

(57) ABSTRACT

An electronic computer-aided design tool includes a design module and a printed electronics printer coupled to the design module. The design module determines one or more design specifications for an electronic device. The printed electronics printer produces one or more printed electronics prototypes of the electronic device based at least in part on at least on at least one of the design specifications. In some embodiments, the electronic computer-aided design tool includes a prototype testing unit that tests prototypes made by the printed electronics printer.

15 Claims, 3 Drawing Sheets

(58) Field of Classification Search
CPC .. G06F 2221/2151; G06F 3/011; G06F 3/017; G06F 3/0219; G06F 3/0233; G06F 3/0237; G06F 3/0238; G06F 8/30; G06F 8/71; H01L 2924/15311; H01L 2224/16225; H01L 25/50; H01L 25/00; H01L 2924/19107; H01L 41/314
USPC .................................................. 716/100–109
See application file for complete search history.

(56) References Cited

U.S. PATENT DOCUMENTS

2011/0023291 A1* 2/2011 Caska ................. H05K 1/0287
  29/739
2011/0256899 A1* 10/2011 Khazei .................. H04B 15/00
  455/517

* cited by examiner

ELECTRONIC COMPUTER-AIDED DESIGN TOOL

PRIORITY CLAIM

This application is a continuation of U.S. patent application Ser. No. 15/048,435 entitled "ELECTRONIC COMPUTER-AIDED DESIGN TOOL" filed Feb. 19, 2016, which is incorporated by reference in its entirety.

BACKGROUND

Field

The present invention relates to the field of electronic device design, development, and production. More specifically, embodiments herein relate to electronic computer-aided design ("ECAD") tools and methods of producing electronic devices and prototypes for such devices.

Description of the Related Art

Today's processor core or other large IC design projects generally involve many contributors, working in collaboration through complex processes. In small companies, the design process may include purchasing intellectual property use rights for most of the parts, and the design of the new section may be only a small part of the total chip both by area and by complexity. In a large company, different groups may be responsible for various different aspects of the design: for example, one for arithmetic functional unit design, another for cache designs, another for memory and I/O interface, another for the instruction interpretation section, etc. A major task is the continuous migration of these contributions to the next silicon process level.

Whether in a small company or large company setting, the technical challenges in mixing and matching sections of designs are significant. As an example, logic sections are often designed using CMOS, memory sections may be designed mainly using NMOS and/or/both PMOS. The characteristics of NMOS circuits are that at logic "0" the lines have low impedance; at logic "1" the lines have high impedance. This causes two problems. The first problem is that in NMOS switching to "0" is fast, however switching to "1" takes relatively long time as one is charging a high impedance line. In PMOS it is the same situation except that now "1" has the low impedance and "0" the high impedance and now discharging the line takes long time. However either of circuit types, PMOS or NMOS are very sensitive to; noise, cross talk and interference at the time the lines that are at the high impedance state.

CMOS solves the problem by just clamping together two circuits one NMOS, one PMOS and thus doubling the amount of transistors. In return CMOS gets fast level change at either 0=>1 or 1=>0 which doubles or even may triple the circuit speed. In addition the lines are at low impedance at logic "0" and at logic "1" state which provides for great noise immunity and high line cross talk barrier. Integrating a system that has some CMOS and some NMOS/PMOS section is a "zoo keeper's" dilemma, as the NMOS/PMOS modules do not tolerate the noise level that CMOS can handle.

ECAD tools are often used by design teams to manage the complex design of new electronic devices. However a significant portion of those ECAD design tools, rather than simplify the design process, may significantly complicate the process by imposing design rule limitations at the behest of various "stakeholders" which include the company's logic, testing and electronics standards department, the foundry's production and test rules, various ECAD simulation (SPICE, etc.). Though such tools are useful, some existing ECAD tools may effectively impose "ECAD design rules cages" that limit the engineers' freedom. In some cases, in particular, attempting to block bad designs ideas from entering into the design arena through stakeholder design rules methods also keep the good ideas out. As an example an engineer may not be allowed, by stakeholder rules, to logically simulate a combinatorics circuit until all electronic rules (layout, SPICE, clock distribution, wire length, etc.) have been applied. A problem is that in current ECAD systems the stakeholder rules may be applied en masse and too early in the design process and limit the designer's capability of obtaining logic simulation results prior to finishing any and all conceivable design inputs.

To increase the efficiency of the design process, prototypes are often used in the design and evaluation of devices under development. Such prototypes may, nevertheless, be themselves be quite expensive and difficult to design, produce, and test. Moreover, such prototypes may lack flexibility in making alterations and modifications needed to advance the production design.

Power usage and consumption of the electronic devices present additional challenges to the electronic device designers. High power consumption of electrical devices may be considered in the context of three major problems: One problem is just the shear cost or availability in wireless devices of the electric power, the second problem is associated with the electrical distribution of the power to the packages containing the silicon dies. A third problem is in some respects the largest: How to get rid of all that power that after the logic and memory circuits got through with it has now turned into heat.

SUMMARY

An ECAD tool, systems and methods of designing and producing electronic devices, and methods of producing and using printed electronics prototype devices are described. In an embodiment, an electronic computer-aided design tool includes a design module and a printed electronics printer coupled to the design module. The design module determines one or more design specifications for an electronic device. The printed electronics printer produces one or more printed electronics prototypes of the electronic device based at least in part on at least on at least one of the design specifications. In some embodiments, the electronic computer-aided design tool includes a prototype testing unit that tests prototypes made by the printed electronics printer.

In an embodiment, a method of designing electronic devices includes: producing one or more printed electronics prototypes of the electronic device based at least in part on at least on at least one of the design specifications; and determining a design of the electronic device based at least in part on information from operating at least one of the printed electronics prototypes of the electronic devices.

In an embodiment, a method of designing electronic devices includes: producing one or more printed electronics prototypes of the electronic device based at least in part on at least on at least one of the design specifications; determining a design of the electronic device based at least in part on information from operating at least one of the printed electronics prototypes of the electronic devices; and producing the electronic device based at least in part on information from the design.

In an embodiment, a method of producing a prototype of an electronic device includes determining one or more design specifications for an electronic device; and producing one or more printed electronics prototypes of the electronic device based at least in part on at least on at least one of the design specifications.

In an embodiment, a prototype for an electronic device includes one or more printed electronics devices. The printed electronics devices simulate one or more portions of the electronic device.

While the invention is described herein by way of example for several embodiments and illustrative drawings, those skilled in the art will recognize that the invention is not limited to the embodiments or drawings described. The emphasis in the examples is to show scope of the architecture, not to present preferred implementation(s). It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION OF EMBODIMENTS

In various embodiments, an ECAD tool includes a printed electronics printer. Instead of using this printed electronics printer to produce an end product, the printer is used, in various embodiments, within the ECAD tool for specific design steps. Using instructions from the ECAD tool, the printed electronic printer may produce a prototype of a production electronic device or a portion of such a device (for example, a processor core). In some cases the produced prototype may be logic prototype performing the logic function at a reduced speed due to the physical differences between the printed electronics prototype and the intended part using on die MOSFET process. In some cases the logic prototype may use noise resistant current mode logic instead of the voltage controlled field effect transistors of the intended MOSFET silicon device. The printer may print conducting metal lines, as well as working transistors, out of which one can build memory cells, gates and line drivers.

In some embodiments, a printer or a sophisticated inkjet is used to print transistors, draw metal lines that may be later on covered with multiple layers of thin film insulating layers that after UV or other treatment hardens and stays in place. Through laser or other radiation sources, layers may be converted from insulator to conductor (or vice versa). In addition, the printing process may produce vias and I/O tabs.

In some embodiments, a printed electronic prototype is made at an enlarged scale relative to a production device under development. For example, in one embodiment, the printed electronic prototype may be about 100 to 1 relative to the production device it simulates. In another embodiment, the printed electronic prototype is about 1,000 to one relative to the production device it simulates.

Printed electronic prototype models produced as described herein may run at a much lower speeds than the device they are used to simulate. For example, instead of running at 3 Giga Hertz, the printed electronics model may only run at 3 Mega Hertz or even 3 Kilo Hertz. The process may allow the logical operation of the new processor core or other device to be fully tested, including having access to any probe point with whisker probes.

ECAD Tool

Figure 1:
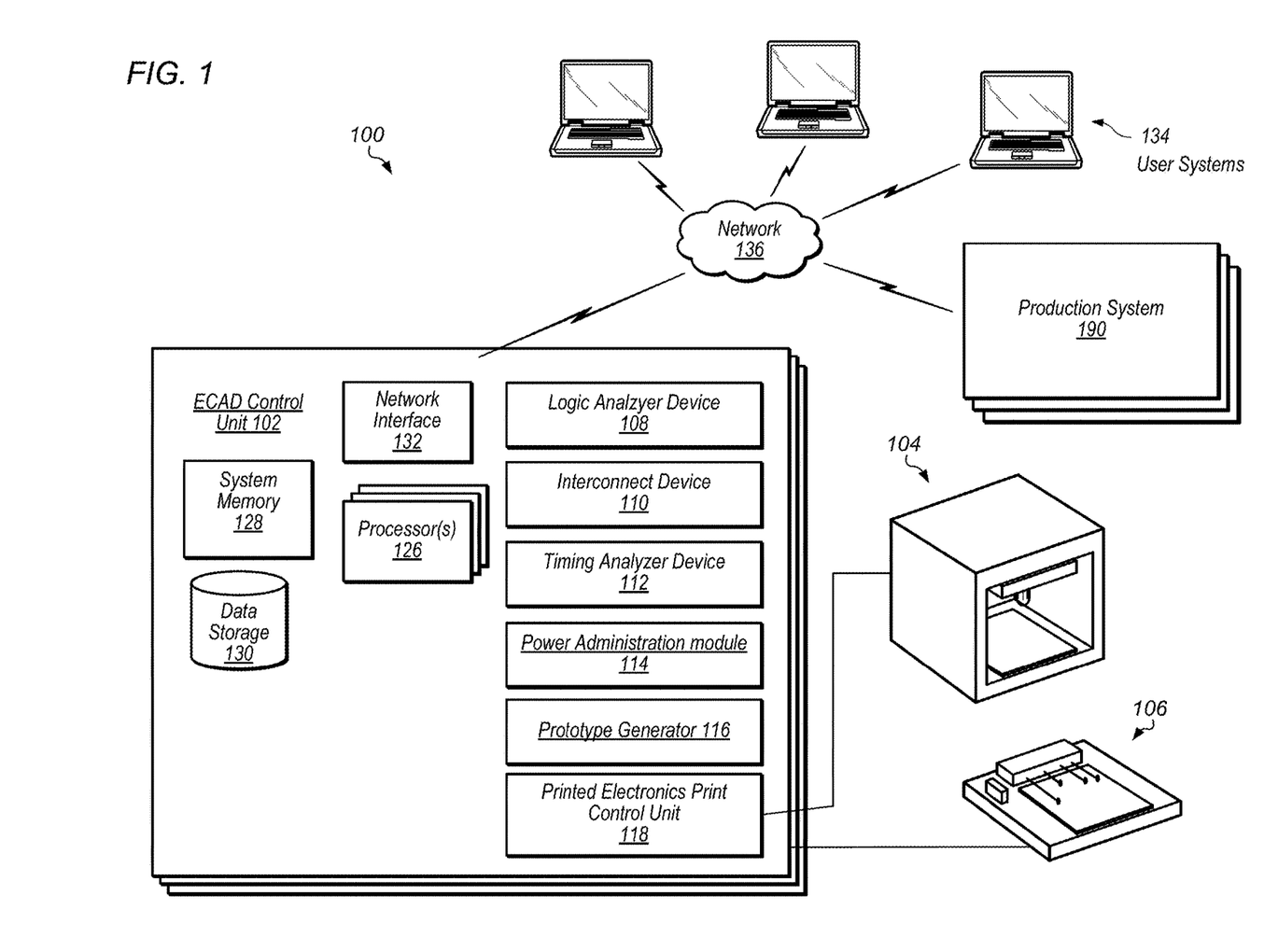
FIG. 1 illustrates one embodiment of electronic computer-aided design tool including a printed electronics prototype printer.

FIG. 1 illustrates one embodiment of electronic computer-aided design tool including a printed electronics prototype printer. ECAD tool 100 includes ECAD control unit 102, electronics device prototype printer 104, and prototype test unit 106. ECAD control unit 102 includes logic analyzer device 108, interconnect analyzer device 110, timing analyzer device 112, power administration module 114, prototype generator 116, and printer control unit 118. Some or all of logic analyzer device 108, interconnect analyzer device 110, timing analyzer device 112, power administration module 114, and prototype generator 116 as a design module for developing design specifications for an electronic device.

ECAD control unit 102 may include one or more computing systems. In the embodiment shown in FIG. 1, ECAD control unit 102 includes processor 126, system memory 128, data storage 130, and network interface card 132. User systems 134 may control, monitor, and provide input to ECAD control unit 102 by way of network 136 and network interface card 132.

Figure 2:
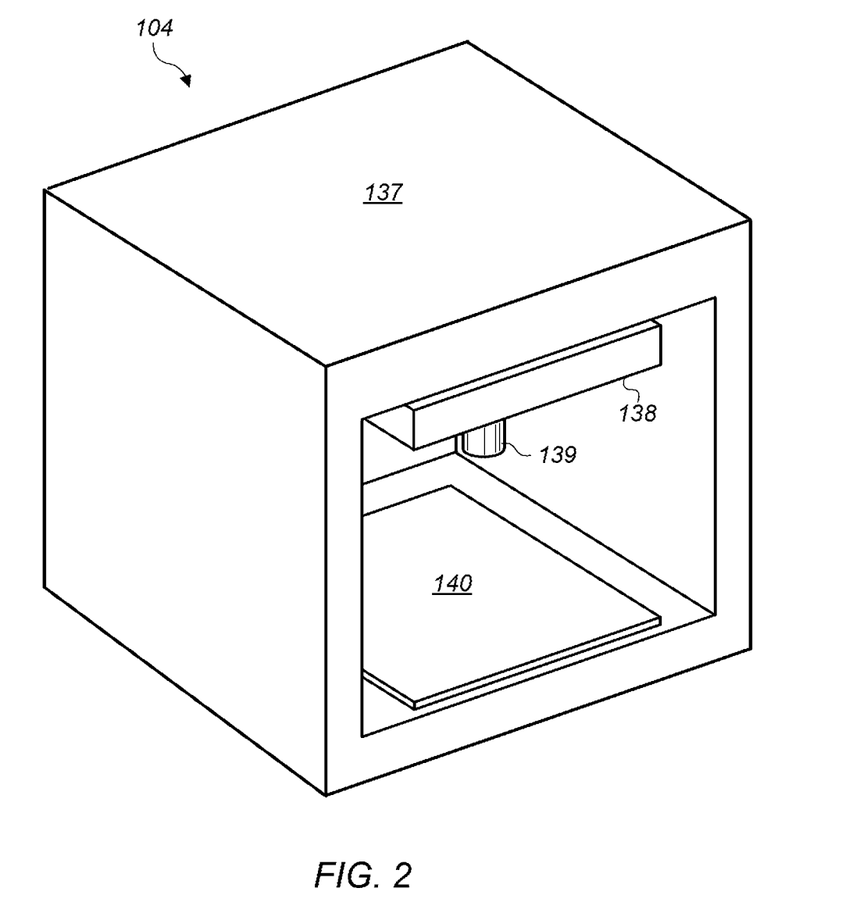
FIG. 2 illustrates one embodiment of a printed electronics prototype printer.

FIG. 2 illustrates one embodiment of a printed electronics prototype printer. Printed electronics device prototype printer 104 includes printer housing 137, carriage 138, and dispenser 139. Prototype device 140 may be produced using electronic device prototype printer 104.

Electronic device prototype printer 104 may use one of various suitable print technologies for printing the elements of the prototype electronic device. In one embodiment, electronic device prototype printer 104 includes a wide carriage printing device using fine line inkjet Mylar roller print bed technology. In certain embodiments, electronics device prototype printer 104 is a flatbed printer and uses a thicker substrate material. The transistors could be voltage mode type or the current mode type (bipolar), the large size of the printed electronic prototype facilitates simple cooling. MOSFET devices will need humidity controlled rooms and extra care in handling as MOSFET is very sensitive to static electricity.

Another printer electronic technology that may be used includes laser beams operating in a frequency that changes a coating or a thin film material from insulator to conductor (or vice versa) and the same or yet another laser that turns on or off the semiconductor properties of organic semiconductors. Printed electronics transistor building techniques may use organic and inorganic material printing depositions, or combinations of both.

Figure 3:
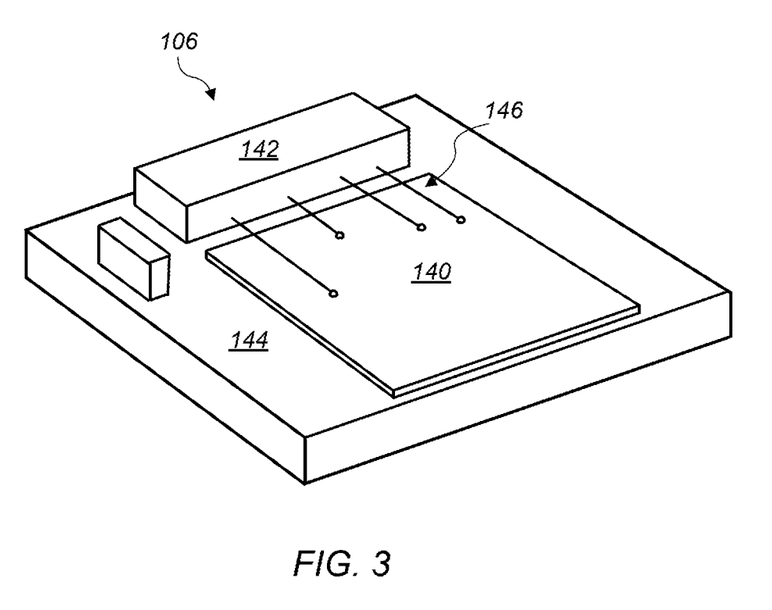
FIG. 3 illustrates one embodiment of a prototype test unit.

FIG. 3 illustrates one embodiment of a prototype test unit. Prototype test unit 106 includes prototype simulator/test control unit 142, prototype test bed 144, and prototype test sensor array 146. Prototype simulator/test control unit 142 may be used to operate devices (including prototypes 140 produced by ECAD tool 100) that are mounted on test bed 144. Test bed 144 may include power and data connections for the device to enable testing and simulations. Various sensors of prototype test sensor array 146 may be employed to gather information about prototypes under test. The information can be accessed through the ECAD tool to allow users to design, develop, and produce production electronic devices as well as provide information for next revision in the design of the current prototype (140). In some embodiments, characteristics of production devices are automatically implemented using information acquired during test or simulation of a printed electronic prototype.

ECAD tool 100 may also be coupled to production systems 160. Production systems 160 may receive information for ECAD tool 100 to make production electronic devices based on information from prototypes.

Prototyping and Electronic Device Development using ECAD Tool

In various embodiments, an ECAD tool as described herein is used to design and produce a logical prototype. The printing device may have, in one example, line resolution of 25 micron and the carriage is one meter wide. Physical "logic prototypes" devices at an area magnification of 10,000 to one, building a square meter "logic prototypes" for a square centimeter of the planned logic devices. For purposes of this example, the flexible electronic transistor area size is 10,000 times larger than the MOSFET transistor area or a size optimized to match the parameters of printable electronic technology.

If the printer's printed area is still too small, the carriage may be widened and the role length per print lengthens. In some cases, the limits may be the ability of the Mylar or other substrate to avoid being stretched or shrunk through the printing process, as it affects accuracy.

Embodiments as described herein may be used to effect changes in "logic highway" traffic organization and all logic correctness tests to take place early in the project. The "residential" areas for logic and memory devices may be first taken based on past experience, since the printed transistors may not scale up as much as the lines and the vias. Thus while still significantly larger than the corresponding MOSFET transistors, the prototype transistors may scale at a different rate than the general prototype scaling, thus may occupy a significantly smaller proportional area.

One objective of this first step is to trade off larger chip area in order to minimize the number of layers. Through this process, the number of layers may be reduced only to, in some cases, five or six. This is still close enough to a true viable Processor-In-Memory (PIM) technology where memory technology is using four metal layers, thus close enough for a working with PIM system models. Through a combination of much fewer layers and spare parts strategies in the processor architecture, lower end-product costs may be achieved.

Several printing revisions per test operation may occur as well as several prints per revision, each for a different engineering group. In addition, groups may print just additional prints of just their relevant area in order to avoid dealing with the clumsiness and electronic sensitivity of square meters size logic prototypes.

After the logic design correctness and "city planning" is done, placement of the MOSFET polygons for the production of the die and wafer masks may be performed. Placement may be automatic or partially automatic. ECAD tools may test and verify that all the electronic parameters, drive capacity, line capacity, noise, cross talk, power distribution, clock distribution, etc. All those tests should be passed in order to make sure that everything is done through best methods. The tools available may account for differences in the electronic parameters of the printed electronics model (as reflected in the prototype) and the silicon device (as reflected in the production unit to be manufactured).

For parts that take the lion share of the space, like memory (registers, RAM, ROM, dynamic) the area that those parts take is relatively easy to determine. Nevertheless, automatic MOSFET polygon placement may include identifying any conflicts or possible alternate solutions.

Additional elements that may be provided, in various embodiments, include the ability to glue on with conducting ink or other technological means connectors to external devices. Suppose, for example, the design is to include an IP copy of a dynamic memory element and the device are also available as a SIP. In this case, the SIP may be connected (rather than fully duplicate the mask artwork in this much larger size).

Accommodations may be made for parts that are sensitive to timing and cannot properly perform under significant clock speed reduction (e.g., a million to one or at even much slower speeds) when the engineer would like to single step the clock while tracing an elusive logic bug. An example is a dynamic memory section that is sure to forget all stored data long before the next clock cycle at slow speeds. In this case, provisions may be made for a "behind the stage super cycle wizard", else the capacitor for a single cell dynamic memory will be excessively large (larger than a meter square or the entire "prototype simulator" sheet.

In certain embodiments, a printed ECAD model approach includes provisions for 3D structures. Vertical silicon dies may be mounted on silicon or other substrate and may include glued zipper connectors for the parts to be glued on by conducting glue to the prototype simulator sections and then the two parts of the connector are "zipped" together.

In some embodiments, after finalizing the prototype simulator and going through automatic MOSFET polygon placement, mask making and silicon prototyping based on engineering's best judgment may be performed. As appropriate, stakeholders from other organizations, such as manufacturing, finance, or marketing may request additional testing, including ECAD analysis, etc. prior to these steps.

In some embodiments, power consumption factors are considered (especially in large footprint types of devices). In getting rid of generated heat, for example, a large footprint 5 metal layers die in a large package may have significant advantages over a much smaller 14 layers die containing approximately the same amount of logic and memory circuits. Due to the larger size a larger area is available for heat transfer, thus no hot spots, and simpler and more even cooling systems.

A solution to a very significant reduction in power consumption is turning off the usage of power to any circuit that does not do productive work. The technical solutions may vary from deactivating the power source to blocking the clock in MOSFET circuits. From macro to micro level, one should be able to turn off the power to all circuits that are not currently being deployed at doing work. This does not mean just turning off a processor core or a fiberoptic transceiver when they are not being used. In various embodiments, this may include turning off power on gates and small circuits that are not being used through this particular DO loop duration. It may also include design approaches that decode a DO loop once into VLIW lines and then in which the instruction interpretation circuits stops interpreting instructions until the DO loop has completed. For example, in certain devices in U.S. patent application Ser. No. 14/863, 022 (which is incorporated by reference as if fully set forth herein) (the "'022 application"), a significant portion of the design, including Functional Units and control circuit are paced by a "control clock" that only activates the pipelines when real work is done. Otherwise, it is a "hurry up and wait" game where the results get through faster than needed for synchronization and then power is burned re-registering the results until they can be used. In MOSFET technology, power is burned by charging and discharging lines. No change of charge on a line or transistor and there is only miniscule amount of power lost to leakage.

The '022 application describes an advanced architecture to address the "ILP wall", including advantages of redundant circuits and "sentence interpretation" instead of one instruction at a time decoding is the ability to turn off power for logic sections as well as instructions interpretation once the loop gets going or turning off unused sections when a program does not parallelize.

In the case of 8 copies of FUs, the advantage is great when the program is "embarrassingly parallel". If the problem is sequential by nature, however, the machine architecture described in the '022 application may look power inefficient (compared to an ILP machine) unless consideration is given to the ability to turn off the power on any circuit not currently being used, for example, seven out of 8 FUs, and all associated crossbars sections as well, are all turned off if the process is sequential.

For an example of a case that is as sequential as possible, consider a modified Fibonacci sequence used to compute rodent population growth using the DO loop.

DO $i=3, 500; K(i)<=(K(i-1)+K(-2))*PD$; END DO;

K is a population in a given year of a particular rodent. PD is a factor <1.0 that represents predation and disease. The formula is applicable if this rodent (squirrels, rats, etc.) are not more than 25% of a particular predator's diet and there is no specific plague type rodent disease present. The calculation is done in floating point as PD is a FP number. In this case, pipelining, speculative execution or similar such techniques may be helpful, outside of automating the index count which an ILP machine achieves through multiple instructions issue techniques. For this DO loop, the FP addition must be finished before the FP multiplication whose result is a prerequisite for the next FP addition is started.

Solutions to address the "power wall" may include tight management of power, in which power is activated only where the circuit does useful work. It is not the space the circuits take on the die but the power they consume. Preferably, power management is done as close as one can get to managing it cycle by cycle without incurring discernable complexity or program execution delay.

In one embodiment, an ECAD design input language for logic circuit limits itself to the following type of negative responses:

1. Syntax or semantics of input line is not understood (A "@" gate is not in our library).
2. A named logic line or gate input has no source.
3. A named logic output or line has no destination
4. A memory device is missing a clock source Once accepted, the logic simulation may be run. A "pre layout" drive load analysis may be requested. In some cases, the system may respond with a list of deficiencies, such as insufficient drive capacity for some lines (based on number of loads) or questionable line length (based on maximum allowed line length). Next, the "city planning" is conducted, which now may include placement of all the test circuits and their corresponding shift registers, including all special features agreed on with the silicon foundry.

In certain embodiments, an application runs on large "teams" of processors to exchange actions and information either through shared memory or through high speed I/O without getting the Operating System involved and doing at a much higher level of security/privacy than current systems are capable of providing.

Computer systems may, in various embodiments, include components such as a CPU with an associated memory medium such as Compact Disc Read-Only Memory (CD-ROM). The memory medium may store program instructions for computer programs. The program instructions may be executable by the CPU. Computer systems may further include a display device such as monitor, an alphanumeric input device such as keyboard, and a directional input device such as mouse. Computer systems may be operable to execute the computer programs to implement computer-implemented systems and methods. A computer system may allow access to users by way of any browser or operating system.

Computer systems may include a memory medium on which computer programs according to various embodiments may be stored. The term "memory medium" is intended to include an installation medium, e.g., Compact Disc Read Only Memories (CD-ROMs), a computer system memory such as Dynamic Random Access Memory (DRAM), Static Random Access Memory (SRAM), Extended Data Out Random Access Memory (EDO RAM), Double Data Rate Random Access Memory (DDR RAM), Rambus Random Access Memory (RAM), etc., or a non-volatile memory such as a magnetic media, e.g., a hard drive or optical storage. The memory medium may also include other types of memory or combinations thereof. In addition, the memory medium may be located in a first computer, which executes the programs or may be located in a second different computer, which connects to the first computer over a network. In the latter instance, the second computer may provide the program instructions to the first computer for execution. A computer system may take various forms such as a personal computer system, mainframe computer system, workstation, network appliance, Internet appliance, personal digital assistant ("PDA"), television system or other device. In general, the term "computer system" may refer to any device having a processor that executes instructions from a memory medium.

The memory medium may store a software program or programs operable to implement embodiments as described herein. The software program(s) may be implemented in various ways, including, but not limited to, procedure-based techniques, component-based techniques, and/or object-oriented techniques, among others. For example, the software programs may be implemented using ActiveX controls, C++ objects, JavaBeans, Microsoft Foundation Classes (MFC), browser-based applications (e.g., Java applets), traditional programs, or other technologies or methodologies, as desired. A CPU executing code and data from the memory medium may include a means for creating and executing the software program or programs according to the embodiments described herein.

A computing system may include, and/or may be implemented as, multiple functional modules or components, with each module or component including one or more resources (e.g., computing resources, storage resources, database resources, etc.). A system may include more or fewer components or modules, and a given module or component may be subdivided into two or more sub-modules or sub-components. Also, two or more of the modules or components can be combined.

As used herein, "ECAD" includes any tools, systems, devices, or methods for designing electronic and electrical devices, including integrated circuits, microprocessors, or other components. ECAD includes those tools and methods referred to as electrical computer-aided design, electronic computer aided design, electronic computer-aided design, and electronic design automation ("EDA").

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Methods may be implemented manually, in software, in hardware, or a combination thereof. The order of any method may be changed, and various elements may be added, reordered, combined, omitted, modified, etc. Changes may be made in the elements described herein without departing from the spirit and scope of the invention as described in the following claims.

What is claimed is:

1. An electronic computer-aided design tool, comprising:
   a printed electronics printer, wherein the printed electronics printer is configured to produce one or more printed electronics prototypes of a production version of an integrated circuit to be formed on a single die, wherein the printed electronics printer is configured to deposit ink on a substrate to form transistors corresponding to transistors of the production version of the integrated circuit on the substrate and interconnects corresponding to interconnects of the production version of the integrated circuit on the substrate such that the produced printed electronics prototype is a prototype of the production version of the integrated circuit to be formed on the single die;
   a prototype testing unit configured to test the at least one of the printed electronic prototypes made by the printed electronics printer;
   a design module configured to make one or more modifications to the design of the integrated circuit based on information from testing of at least one of the printed electronics prototypes, wherein the integrated circuit comprises a MOSFET device, wherein the design module is configured to determine a design for the MOSFET device based on information from testing at least one of the printed electronics prototypes; and
   a production module configured to produce a production version of the integrated circuit based at least in part on information from testing of at least one of the printed electronics prototypes.

2. The electronic computer-aided design tool of claim 1, wherein the prototype testing unit is configured to test the prototype to verify logic of the integrated circuit.

3. The electronic computer-aided design tool of claim 1, wherein the prototype testing unit is configured to test the prototype to verify no race conditions exist in integrated circuit.

4. The electronic computer-aided design tool of claim 1, wherein the prototype testing unit is configured to test the prototype to isolate power active but not operatively working parts in the integrated circuit.

5. The electronic computer-aided design tool of claim 1, wherein the prototype testing unit is configured to test the prototype at reduced speed to verify logic of the production version of the integrated circuit.

6. The electronic computer-aided design tool of claim 1, wherein the prototype testing unit is configured to test timing dependencies of the production version of the integrated circuit.

7. The electronic computer-aided design tool of claim 1, further comprising a logic simulator configured to operate at least one of printed electronics prototype to simulate the logic of the production version of the integrated circuit.

8. The electronic computer-aided design tool of claim 1, wherein the printed electronics printer is configured to produce a printed electronics prototype that is on an enlarged physical scale compared to the production version of the integrated circuit.

9. The electronic computer-aided design tool of claim 1, wherein the design module is configured to make at least one modification to the interconnect design of the production version of the integrated circuit based on information from testing of a prototype.

10. The electronic computer-aided design tool of claim 1, wherein the design module is configured to make at least one modification to reduce metal interconnect layers in the production version of the integrated circuit.

11. The electronic computer-aided design tool of claim 1, wherein the design module is configured to determine a design for the die based on information from testing at least one of the printed electronics prototypes.

12. The electronic computer-aided design tool of claim 1, wherein the design module is configured to make at least one modification to make or more power saving changes to the design based at least in part on information from testing at least one printed electronics prototype.

13. The electronic computer-aided design tool of claim 1, wherein the printed electronics printer is configurable to print a printed electronics prototype for the production version of the integrated circuit that is at least about 100 to 1 of the physical size of the production version of the integrated circuit.

14. A method of producing a production version of an integrated circuit, wherein the integrated circuit comprises a MOSFET device, comprising:
   producing, by a printed electronics printer, one or more printed electronics prototypes of a production version of an integrated circuit to be formed on a single die, wherein comprises depositing ink on a substrate to form transistors corresponding to transistors of the production version of the integrated circuit on the substrate such that the produced printed electronics prototype is a prototype of the production version of the integrated circuit to be formed on the single die;
   testing, by a prototype testing unit, the at least one of the printed electronic prototypes made by the printed electronics printer, wherein testing the prototype comprises verifying logic of the integrated circuit;
   making, by a design module, one or more modifications to the design of the integrated circuit based on information from testing at least one of the printed electronics prototypes;
   determining, by the design module, a design for the MOSFET device based on information from testing at least one of the printed electronics prototypes; and
   producing a production version of the integrated circuit based at least in part on information from testing of at least one of the printed electronics prototypes.

15. An electronic computer-aided design tool, comprising:
- a printed electronics printer, wherein the printed electronics printer is configured to produce one or more printed electronics prototypes of a production version of an integrated circuit to be formed on a single die, wherein the printed electronics printer is configured to deposit ink on a substrate to form transistors corresponding to transistors of the production version of the integrated circuit such that the produced printed electronics prototype is a prototype of the production version of the integrated circuit to be formed on the single die;
- a prototype testing unit configured to test the at least one of the printed electronic prototypes made by the printed electronics printer;
- a design module configured to make one or more modifications to the design of the integrated circuit based on information from testing of at least one of the printed electronics prototypes, wherein the integrated circuit comprises a MOSFET device, wherein the design module is configured to determine a design for the MOSFET device based on information from testing at least one of the printed electronics prototypes; and
- a production module configured to produce a production version of the integrated circuit based at least in part on information from testing of at least one of the printed electronics prototypes,
- wherein the printed electronics printer is configured to produce a printed electronics prototype that is on an enlarged scale compared to the production version of the integrated circuit.

* * * * *